(12) United States Patent
Rumer et al.

(10) Patent No.: US 7,247,517 B2
(45) Date of Patent: Jul. 24, 2007

(54) METHOD AND APPARATUS FOR A DUAL SUBSTRATE PACKAGE

(75) Inventors: Christopher L. Rumer, Chandler, AZ (US); Kuljeet Singh, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 131 days.

(21) Appl. No.: 10/676,883

(22) Filed: Sep. 30, 2003

(65) Prior Publication Data

US 2005/0067714 A1    Mar. 31, 2005

(51) Int. Cl.
  *H01L 21/48*   (2006.01)
  *H01L 21/50*   (2006.01)
(52) U.S. Cl. .................. 438/107; 438/112; 438/459; 257/E21.507
(58) Field of Classification Search .......... 438/112, 438/107, 459, 667; 257/691, 698, E21.506, 257/E21.507
See application file for complete search history.

(56) References Cited

U.S. PATENT DOCUMENTS

| | | | |
|---|---|---|---|
| 5,424,245 A | | 6/1995 | Gurtler et al. |
| 5,811,877 A | * | 9/1998 | Miyano et al. ............. 257/706 |
| 5,855,821 A | * | 1/1999 | Chau et al. ................. 252/514 |
| 5,977,640 A | | 11/1999 | Bertin et al. |
| 6,168,969 B1 | | 1/2001 | Farnworth |
| 6,175,160 B1 | | 1/2001 | Paniccia et al. |
| 6,281,042 B1 | * | 8/2001 | Ahn et al. .................. 438/108 |
| 6,429,509 B1 | | 8/2002 | Hsuan |
| 6,548,376 B2 | * | 4/2003 | Jiang ........................... 438/459 |
| 6,589,180 B2 | * | 7/2003 | Erikson et al. ............. 600/459 |
| 6,765,152 B2 | * | 7/2004 | Giri et al. .................... 174/260 |
| 2002/0102768 A1 | | 8/2002 | Shioga et al. |

FOREIGN PATENT DOCUMENTS

| | | |
|---|---|---|
| EP | 1 280 203 | 1/2003 |
| TW | 504819 | * 10/2002 |
| WO | WO 03/050850 | 6/2003 |

OTHER PUBLICATIONS

Reche, J., "Wafer Thinning and Thru-Silicon Vias", The Path to Wafer Level Packaging, 41 pages, Tru-Si Technologies, www.trusi.com, IEEE/CPMT Meeting, Santa Clara (CA) May 10, 2000.
PCT Search Report of International application No. PCT/US2004/032451, filed Sep. 29, 2004.

* cited by examiner

*Primary Examiner*—Cardidad Everhart
(74) *Attorney, Agent, or Firm*—Blakely, Sokoloff, Taylor & Zafman LLP (57) ABSTRACT

A semiconductor die having a through via formed therein is disclosed. A first conductive layer is formed on the front side of the die and a second conductive layer is formed on the backside of the die, and coupled with the through via. A first package substrate is electrically coupled with the first conductive layer, and a second package substrate is electrically coupled with the second conductive layer. In another embodiment, a substrate ball electrically couples the first and second package substrates. In a further embodiment, a flip chip bump is attached to the first package substrate.

15 Claims, 7 Drawing Sheets

METHOD AND APPARATUS FOR A DUAL SUBSTRATE PACKAGE

FIELD OF THE INVENTION

The present invention relates generally to semiconductor packaging, and specifically to power and signal routing to semiconductor dies.

BACKGROUND

Integrated circuits (ICs), and especially microprocessors, are becoming increasingly complex. Microprocessors are requiring increasingly more power as they become more complex. Microprocessors are also requiring additional signal inputs to facilitate their increased processing capability. A semiconductor package may use a package substrate to deliver power from a power supply and signals from outside the package to a semiconductor die. A package substrate is connected with the semiconductor die to increase the distribution area of signals moving to and from the semiconductor die. Two current methods for connecting a package substrate to a semiconductor die include a wire bond molded matrix array package (WB-MMAP) and a flip chip molded matrix array package (FC-MMAP).

Figure 1A:
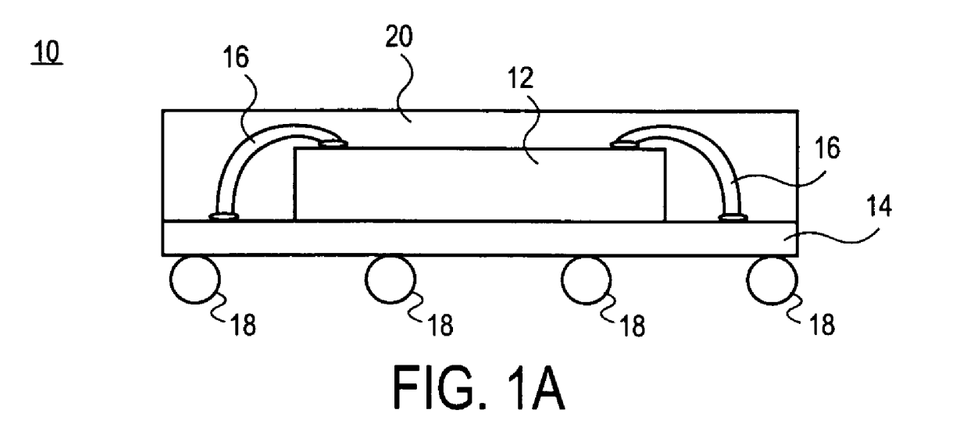
FIG. 1A illustrates a semiconductor die coupled to a package substrate using a wire bond molded matrix array package (WB-MMAP).

FIG. 1A illustrates a semiconductor die coupled to a package substrate using a wire bond molded matrix array package (WB-MMAP). The package 10 includes a semiconductor die 12, such as a microprocessor, a chipset, a memory device, an application specific integrated circuit (ASIC), etc., mounted on a package substrate 14. The semiconductor die 12 transmits signals to and receives signals from the package substrate 14 using several bond wires 16. The bond wires 16 are typically copper or aluminum and allow electrical communication between pads on the package substrate 14 and the device side of the semiconductor die 12. The package 10 is connected to an external component through interconnect devices 18, which may be Ball Grid Array (BGA) interconnects such as solder balls and metal filled polymers, Pin Grid Array (PGA) interconnects such as pins, Land Grid Array (LGA) interconnects such as lands, etc. The die 12 and bond wires 16 are encapsulated in a molding material 20, such as an epoxy, to prevent damage.

Figure 1B:
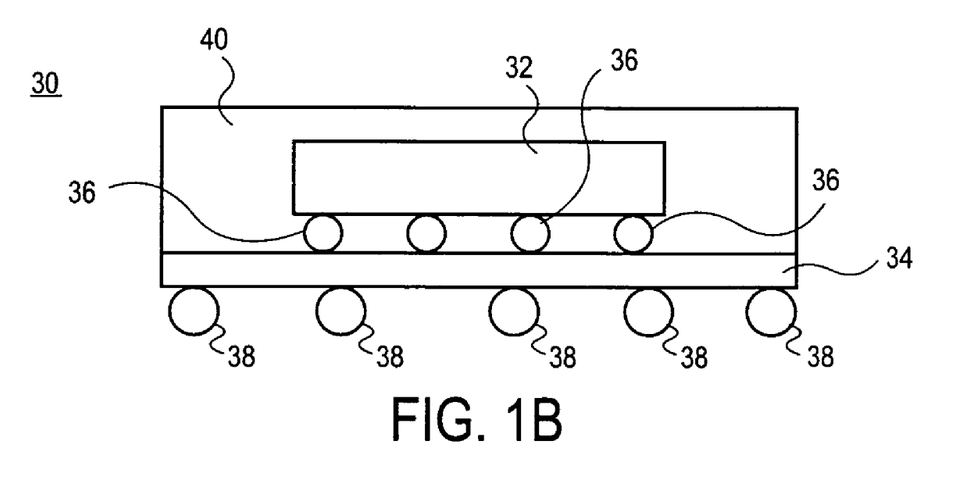
FIG. 1B illustrates a flip chip molded matrix array package (FC-MMAP).

FIG. 1B illustrates a flip chip molded matrix array package (FC-MMAP). The package substrate 30 includes a semiconductor die 32 and a package substrate 34. The semiconductor die 32 is connected with the package substrate 34 through solder bumps 36, which may be controlled collapse chip connection (C4) or other conductive bumps. The solder bumps 36 are formed on pads on the active or device side of the semiconductor die 32 before the semiconductor die 32 is mounted on the package substrate 34. The C4 bumps 36 are conductive so that the device side of the semiconductor die 32 can communicate with the package substrate 34. The signals that are traveling to and from the semiconductor die 32 are routed through the package substrate 34 and out of the package using the interconnects 38. The interconnect devices 38 may be solder balls or metal filled polymers, such as BGA interconnects, PGA interconnects, etc. The die 32 is encapsulated in a molding material 40, such as an epoxy, to prevent damage.

Figure 1C:
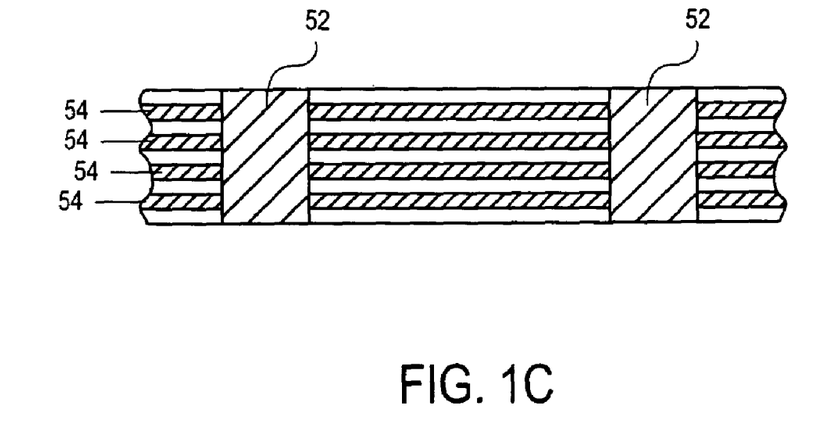
FIG. 1C illustrates a typical package substrate.
Figure 1D:
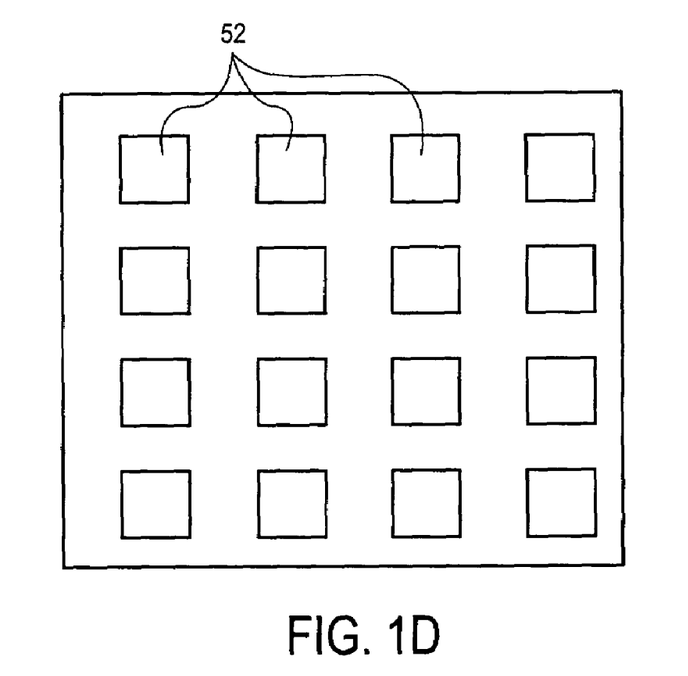
FIG. 1D illustrates a bottom view of a package substrate.

FIG. 1C illustrates a typical package substrate. The package substrate 50 provides a larger area to distribute signals from a die, as well as providing physical protection for the die. The package substrate 50 includes several vias 52 and planes 54. The vias 52 facilitate vertical signal travel within the substrate 50, and the planes 54 allow horizontal travel within the substrate 50. The vias 52 can connect with the bond wires 16 or the solder bumps 36. The bottom of the vias 52 can connect to the interconnects 18 or 38. FIG. 1D illustrates a bottom view of the package substrate 50. As can be seen in FIG. 1D, the bottom of the vias 52 are spread throughout the surface of the package substrate 50. A typical package substrate 50 may include several thousand vias 52. A top view of the package substrate 50 would be similar, except that the pads would conform to the connection method (wirebond or flip chip) and the size of the die.

Newer ICs that require more power and more signal interconnects may have exhausted the capacity of a single package substrate such as the package substrates 14, 34, and 50 above. As a result, when using a single package substrate for power and signal distribution, the single package substrate may limit the speed of the processor. Further, the increased resistance caused by the relatively small amount of conductive surface available in a signal package substrate may also contribute to higher operating temperatures.

BRIEF DESCRIPTION OF THE DRAWINGS

FIG. 4D illustrates a wafer having conductive bumps.

DETAILED DESCRIPTION

Described herein is a method and apparatus for a dual substrate package design. In the following description, numerous specific details are set forth. However, it is understood that embodiments may be practiced without these specific details. For example, well known equivalent materials may be substituted in place of those described herein, and similarly, well known equivalent techniques may be substituted in place of the particular semiconductor processing techniques disclosed. In other instances, well known structures and techniques have not been shown in detail in order not to obscure the understanding of this description.

According to an embodiment of the present invention, a dual substrate package design is disclosed. A first package substrate is attached to a backside of a semiconductor die and second package substrate is attached to a frontside of the semiconductor die. Through vias are bored in the backside of the semiconductor die to form connections between the active frontside of the die and the first package substrate. The second package substrate is attached to pads coupled to active elements in the frontside of the die. The first and second package substrates are coupled to each other with substrate balls.

Figure 2A:
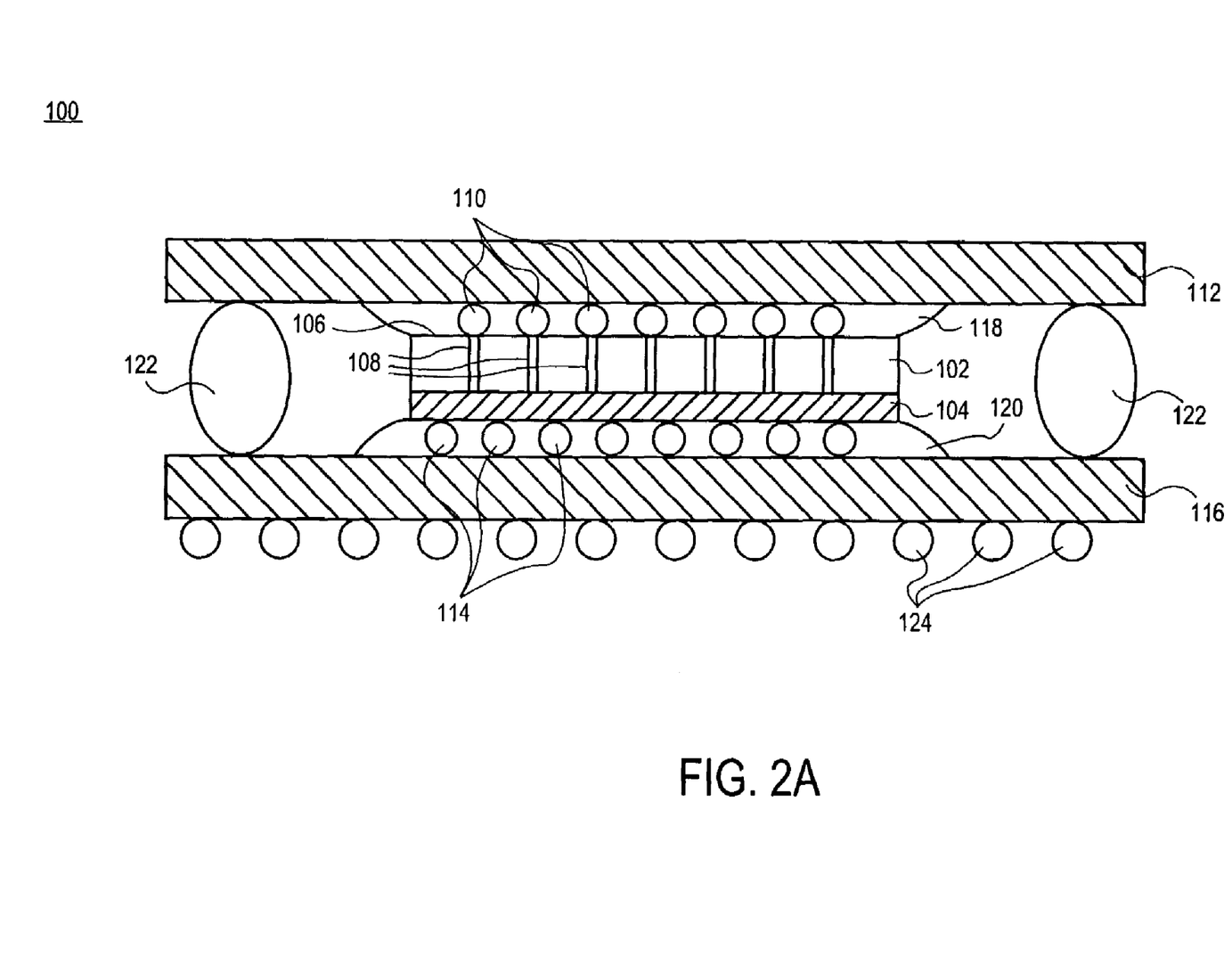
FIG. 2A illustrates a dual substrate semiconductor package according to one embodiment.

FIG. 2A illustrates a dual substrate semiconductor package according to one embodiment. A semiconductor package 100 includes a semiconductor die 102 having an active side 104. The semiconductor die 102 may be formed from a single crystal silicon or other semiconductor substrate. The active side 104 contains the semiconductor devices that perform the operations of the IC. The active (or device) side 104 is formed using various well-known semiconductor processing techniques. The active side 104 is typically less than 10 microns (μm) deep. The active side 104 may include any circuitry, such as transistors, capacitors, etc. used in central processing units (CPUs), chipsets, memory devices, application specific integrated circuits (ASICs), etc. The active side 104 may also include metallization, such as interconnects, which is coupled with bond pads formed on its surface to create external connections.

The semiconductor die 102 has a backside 106 having several through vias 108 formed therein. The through vias 108 allow for an electrical connection on the backside of the die 102 with the active device side of the die 104. The through vias 108 may be formed by first thinning the die 102. A semiconductor die 102 typically requires a thickness of between 700 and 800 μm to facilitate the processing steps of creating the active side 104. In order to create connections with the active side of the die 104 through the backside of the die, the die may be thinned to a thickness of approximately 75–175 μm using a back grinding, spin etching, chemical mechanical polishing (CMP), and etc. process. Once the die 102 is thinned, the through vias 108 can be formed by any known technique including a deep reactive ion etch (RIE) followed by a plating technique to fill the bore with a conductive material such as copper.

Interconnect devices 110 are coupled with the through vias 108 to create an electrical connection with a backside package substrate 112. The backside package substrate 112 is added to increase the number of conductive lines available to deliver power to the die 102 and to transport signals to and from the die 102. Interconnect devices 114 are also formed on the device side 104 of the package substrate 102 to allow for connection between the device side 104 of the semiconductor die 102 and the frontside package substrate 116. The interconnect devices 110 and 114 may be, flip chip solder bumps such as Controlled Collapse Chip Connect (C4) or other interconnects. The interconnect devices 110 and 114 may be formed by stencil printing, electroplating, stud bumping, or other well known techniques.

Figure 2B:
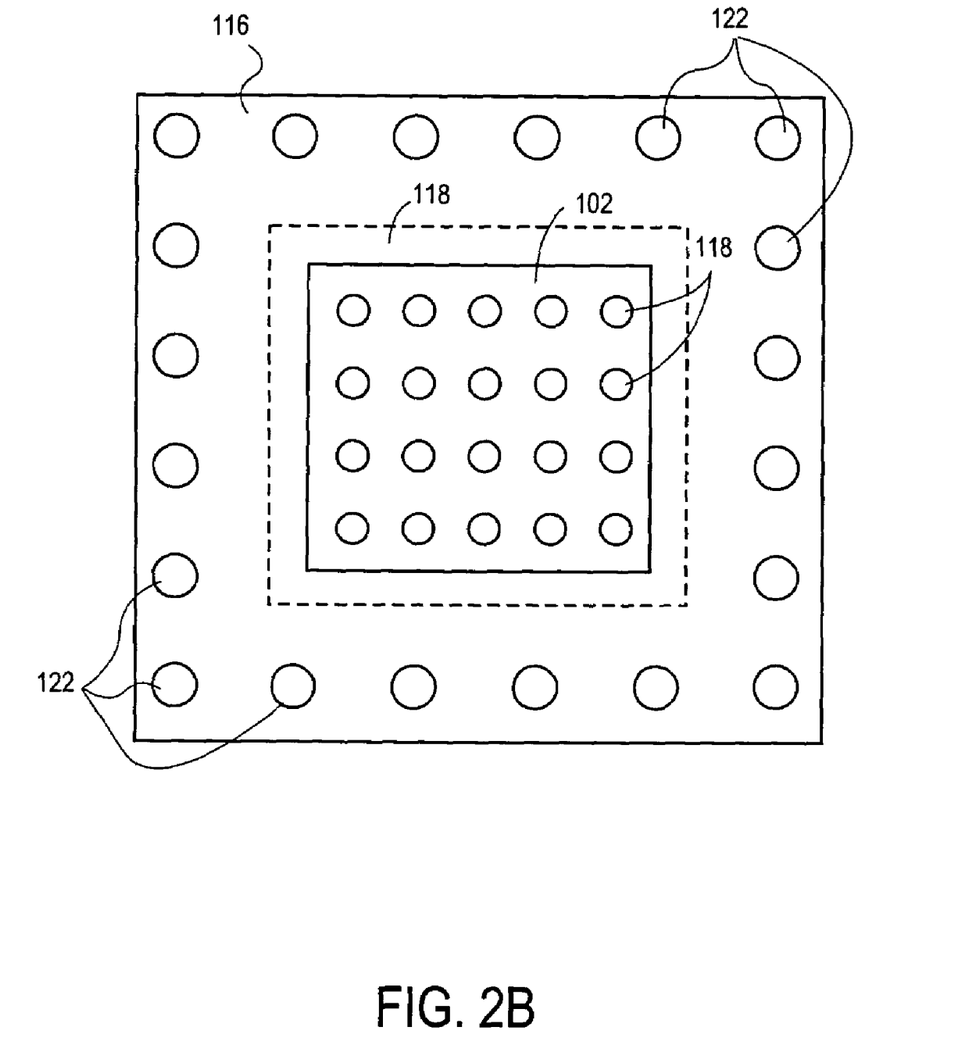
FIG. 2B illustrates an overhead view of the package.

Underfill layers 118 and 120 provide insulation and protection for the interconnects 110 and 114. The underfill layers 118 and 120 also create adhesion between the package substrates 112 and 116 and the semiconductor die 102. The substrate balls 122 allow for communication between the backside package substrate 112 and the frontside package substrate 116. The substrate balls 122 ring the package substrates 112 and 116, and allow for communication between the two. This is shown in FIG. 2B. FIG. 2B illustrates an overhead view of the package 100. The package 100 is shown with the backside substrate 112 removed. As can be seen, the substrate balls 122 ring the edge of the package substrate 116 and couple with pads on the package substrate 116.

Figure 3:
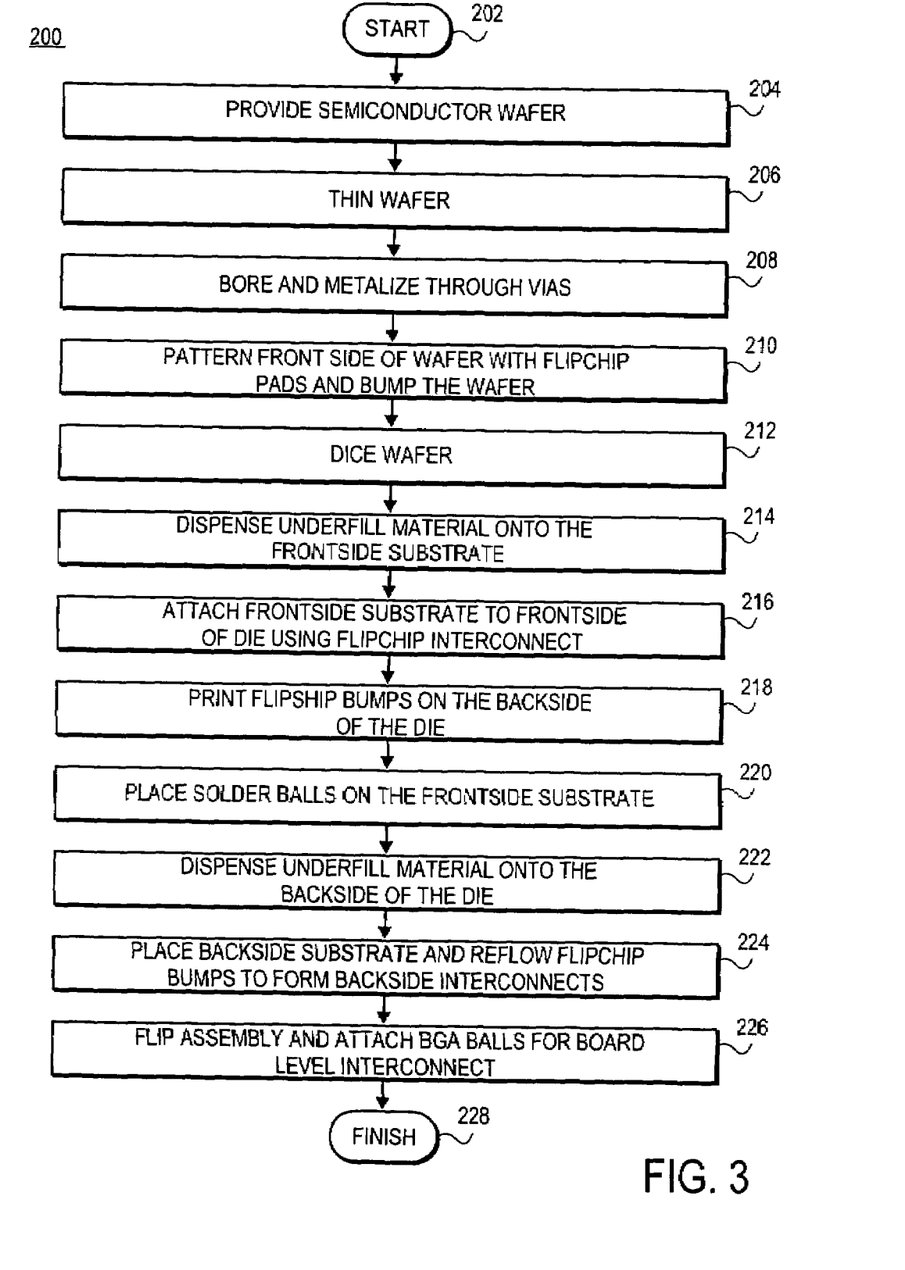
FIG. 3 illustrates a process of forming a dual substrate semiconductor package.
Figure 4A:
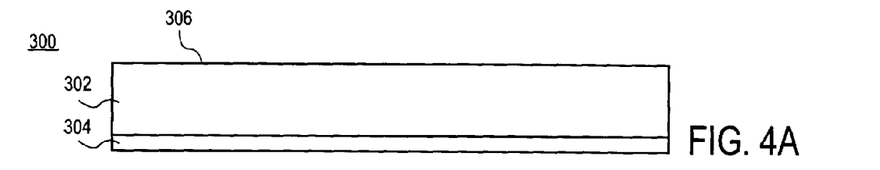
FIG. 4A illustrates a processed semiconductor wafer having an active device side.

FIG. 3 illustrates a process of forming a dual substrate semiconductor package. FIGS. 4A through 4M illustrate the process described in FIG. 3. Process 200 starts in start block 202. In block 204 a semiconductor wafer is provided. FIG. 4A illustrates a processed semiconductor wafer 302 having an active device side 304 and a backside 306. The device side 304 contains semiconductor devices including transistors, resistors, etc. to create circuits for a CPU, chipset, ASIC, memory, etc. The device side 304 is formed using well known techniques and processes. The backside 306 does not contain any active elements, and therefore can be modified without affecting the functionality of the IC. The wafer 302 has an initial thickness of between 700 and 800 μm in one embodiment in order to facilitate processing of the wafer.

Figure 4B:
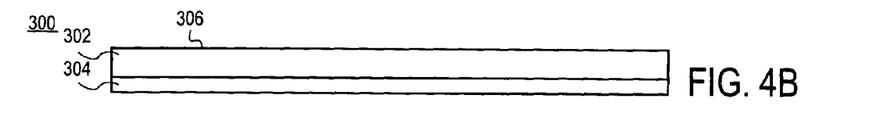
FIG. 4B illustrates a wafer that has been thinned.

In block 206, the wafer 302 is thinned to facilitate a through via. FIG. 4B illustrates a wafer 302 that has been thinned. The backside 306 of the wafer 302 may be thinned using, for example, a back grinding, spin etching, CMP, and etc. process. Since all of the active elements of the microprocessor or other IC are contained in the device side 304, the backside 306 of the wafer 302 can be thinned without affecting the functionality of the IC. In one embodiment, the wafer 302 is ground to bring the device side 304 of the wafer 302 closer to the backside 306 of the wafer 302 in order to facilitate the through vias. The wafer 302 is thinned to a thickness of 75–175 μm in one embodiment.

Figure 4C:
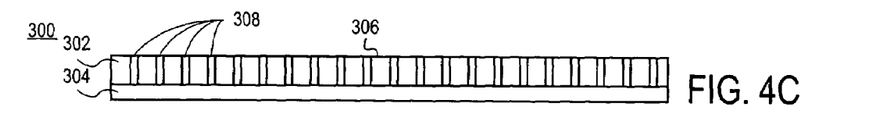
FIG. 4C illustrates a wafer having through vias formed in it.

In block 208, through vias are bored and metallized. FIG. 4C illustrates a wafer 302 having through vias 308 formed in it. The through vias 308 provide an electrical connection between the backside 306 and the active or device side 304. The through vias 308 may be formed using a reactive ion etch (RIE) or other appropriate process. The through vias 308 are formed by first masking and then boring through the backside of the wafer 302 to provide a channel to the semiconductor devices in the active layer 304. The channel may connect with the first metal layer in the active side 304. In another embodiment, the channel may connect with the surface of the active side of the die. Once a bore is formed to facilitate the through via 308, the through via 308 is metallized in order to provide an electrical connection between the backside 306 and the device side 304 of the wafer 302. The through via 308 may be metallized using a plating technique such as electroplating, electroless plating, etc. A conductive material such as copper or aluminum is deposited in the bore using the plating process, and the through via 308 is formed.

In block 210, the front side of the wafer 302 is patterned with flip chip pads and is bumped. FIG. 4D illustrates a wafer having conductive bumps. Flip chip pads are formed on the active side 304 on the wafer 302 to facilitate electrical connections with the semiconductor devices found on the front side 304. Once the pads have been formed, solder or other conductive bumps 310 may be patterned on the pads. The bumps 310 are conductive and can connect the pads, and therefore the semiconductor devices, to the outside of the semiconductor wafer 302. The bumps 310 can be deposited on the flip chip pads using a stencil printing, electroplating, stud bumping, or other well-known process. The bumps 310 may be C4 or other flip chip bumps.

Figure 4E:
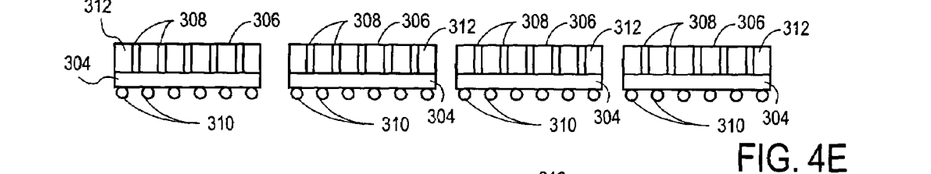
FIG. 4E illustrates a wafer diced into several semiconductor dies.

In block 212, the wafer 302 is diced. FIG. 4E illustrates a wafer diced into several semiconductor dies. The wafer 302 may be diced, or singulated, into several semiconductor dies 312. The semiconductor dies 312 contain the semiconductor elements required for a single integrated circuit or microprocessor. The wafer 302 typically contains several dozen or more semiconductor dies 312. In order to form individual ICs, the dies 312 are diced, or singulated, from the larger wafer 302 using a wafer saw, laser, etc. After singualtion, several semiconductor dies 312 are formed.

Figure 4F:
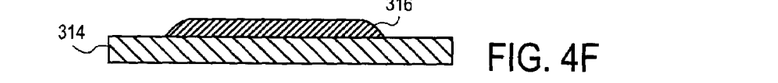
FIG. 4F illustrates an underfill material dispensed onto a package substrate.

In order to distribute signals and power to and from a semiconductor die, a package substrate is typically used. As described above, package substrates comprise several conductive lines, and can distribute signals from the bumps 310 to outside the semiconductor die 312. The package substrate can spread the power and signals out to a larger area than the semiconductor die 312 encompasses. In block 214, an underfill material is dispensed onto a frontside substrate. FIG. 4F illustrates an underfill material dispensed onto a package substrate. The frontside package substrate 314 will distribute power and signals to and from the front, or active side 304 of the semiconductor die 312. An underfill material 316, such as an epoxy, is distributed onto the package substrate 314. The underfill material 316 can adhere the semiconductor die 312 to the package substrate 314 as well as electrically isolating and providing protection for the bumps 310. The underfill 316 can also protect the bumps 310 from the effects of the different coefficients of thermal expansion (CTE) of the die 312 and the bumps 310. In one embodiment, the underfill material 316 is a no-flow underfill material that is deposited on the substrate 314 before the die 312 is attached. In alternative embodiments, a capillary or other underfill material may be deposited after the die 312 is attached to the substrate 314. However, in one embodiment, it may be advantageous to use the no-flow underfill material because it may be easier to dispense than a capillary underfill. It is understood that other types of underfill may also be used.

Figure 4G:
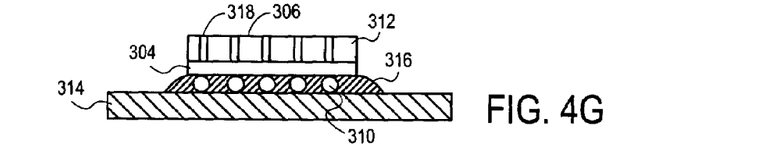
FIG. 4G illustrates a semiconductor die and attached to a package substrate.

In block 216, the frontside substrate 314 is attached to the front side 304 of the die 312 using a flip chip interconnect. FIG. 4G illustrates a semiconductor die 312 attached to a package substrate 314. The underfill material 316 adheres the semiconductor die 312 to the package substrate 314. The bumps, or interconnects 310 penetrate the underfill material 316 until they contact pads on the package substrate 314. Using well known flip chip interconnect methods, the interconnects 310 can be heated using a furnace or other technique, to reflow the solder or other material to create a connection with the pads on the package substrate 314. After the solder is reflowed, the interconnects 310 will cool and form a connection between the bond pads on the semiconductor die 312 and the package substrate 314 to facilitate power and signal distribution.

Figure 4H:
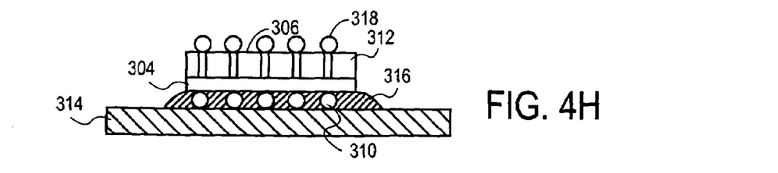
FIG. 4H illustrates a semiconductor die having flip chip bumps printed on its backside.

In block 218, flip chip bumps are printed on the backside of the die 312. FIG. 4H illustrates a semiconductor die 312 having flip chip bumps 318 printed on its backside 306. The through vias 308 provide an electrical connection to the device side 304 of the semiconductor die 312. In order to connect the through vias outside of the semiconductor die 312 interconnects, such as flip chip bumps 318, are patterned on the back side of the die 312. The flip chip bumps 318 are electrically coupled to the through vias 308. The flip chip bumps 318 can thereby create electrical connections from the backside 306 to the device side 304 of the die 312.

Figure 4I:
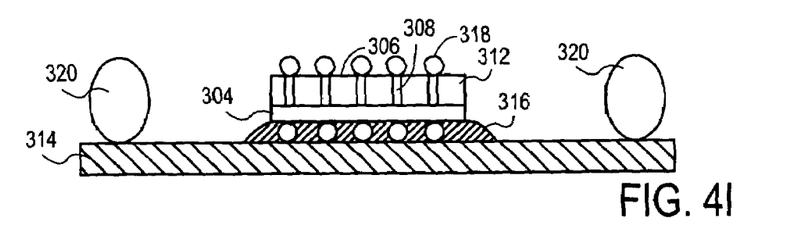
FIG. 4I shows a semiconductor package having solder balls on a frontside substrate.

In block 220, substrate balls are placed on the frontside substrate 314. FIG. 4I shows a semiconductor package having substrate balls 320 on a frontside substrate 314. The substrate balls 320 can provide an electrical connection between the frontside substrate 314 and a backside substrate which will be later added to the package. The substrate balls 320 may have a thickness of approximately 225 µm, although the thickness may vary depending on the size of the die 312, etc. The substrate balls 320 may be connected to pads in the frontside substrate 314, and will ring the frontside substrate 314 (see FIG. 2B). In this way, signals and power can be delivered to and from the backside substrate into the frontside substrate 314. In one embodiment, only the frontside substrate 314 will be electrically coupled to the outside of the package 300. Therefore, if the backside substrate is not connected to the outside of the package 300, the substrate balls 320 can be added to deliver signals between the backside substrate and the frontside substrate 314. In one embodiment, as can be seen in FIG. 4I, the substrate balls 320 are substantially larger than the bumps 310 and 318. Therefore, even though there may be fewer substrate balls 320, since they are larger they can deliver more current. In other embodiments, the frontside substrate 314 and the backside substrate are electrically coupled using alternative technologies, including an interposer and a pin/through hole attachment.

Figure 4J:
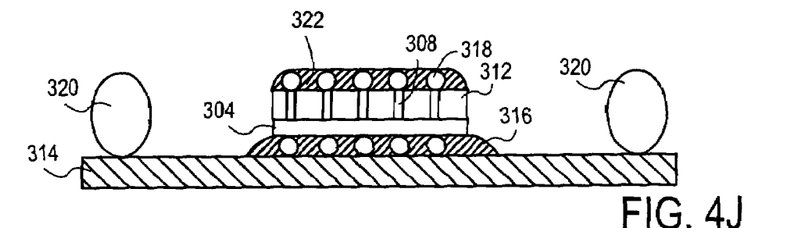
FIG. 4J illustrates a semiconductor die having underfill material dispensed thereon.

In block 222, underfill materials are dispensed onto the backside of the die. FIG. 4J illustrates a semiconductor die 312 having underfill material 322 dispensed thereon. In one embodiment, the underfill material 322 is a no-flow underfill material such as an epoxy. The underfill material 322, like the underfill material 316 provides mechanical support, contamination protection, and improves package reliability. In one embodiment, a no-flow underfill material 322 is dispensed onto the die 312 before a backside substrate is added. However, in other embodiments, it may be possible to dispense a capillary or other underflow material once the backside substrate has been attached.

In an alternate embodiment, the frontside substrate 314 is attached to the die 312 without using the underfill 316, and a backside substrate 324 is attached without using the underfill 322. After the frontside and backside package substrates 314 and 324 have been attached, mold material can then be forced between the frontside 314 and backside 324 substrates to underfill both substrates in a single step.

Figure 4K:
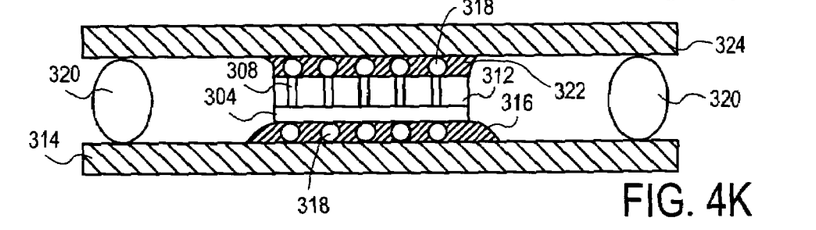
FIG. 4K illustrates a semiconductor package having a backside substrate attached.

In block 224, a backside substrate is placed on the package 300 and the flip chip bumps 318 are reflowed to form backside interconnects. FIG. 4K illustrates a semiconductor package 300 having a backside substrate 324 attached. A backside substrate 324 is placed on top of the package assembly 300. The backside substrate 324 distributes signal and power to and from the semiconductor die 312. The flip chip bumps 318 and the solder balls 320 are reflowed in order to create a connection between pads on the backside substrate 324 and the respective bumps 318. The substrate balls 320 and the flip chip bumps 310 and 318 are reflowed in a furnace to heat the metal and cause it to bond to pads on the package substrates 314 and 324. By attaching the backside substrate 324, a dual substrate package has been formed.

Figure 4L:
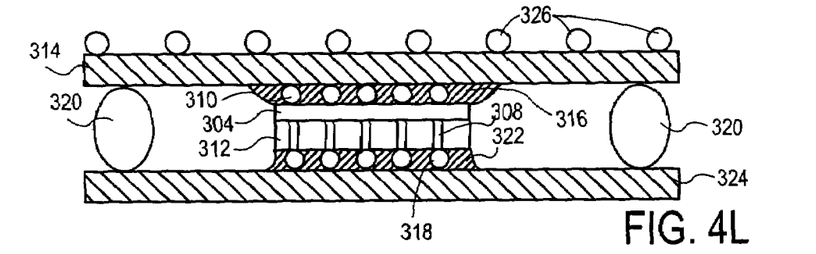
FIG. 4L illustrates an inverted semiconductor package having BGA balls attached.

In block 226, the assembly is flipped and ball grid array (BGA) balls are attached for board level interconnect. FIG. 4L illustrates an inverted semiconductor package having BGA balls 326 attached. In order to allow the die 300 to communicate with the devices outside the package 300, electrical connections must be made with the package substrate 314. The BGA balls 326 can be attached to the bottom side of the frontside substrate 314. The BGA balls may be applied using a stencil printer, ball shooter, etc. The BGA balls 326 attached to the pads formed on the bottom side of the frontside substrate 314, such as those shown in FIG. 1D. In one embodiment, the package assembly 300 must be flipped before the BGA balls 326 are attached. Assembly of package elements typically occurs from the topside of the package 300. Since the frontside substrate 314 is on the bottom side of the package, in order to attach the BGA balls 326, the package substrate 314 must be flipped. Once the package assembly 300 is flipped, the BGA balls 326 can be attached as described above. It is understood that other well-known interconnect technologies, such as Pin Grid Array (PGA), Land Grid Array (LGA), etc. may also be used.

Figure 4M:
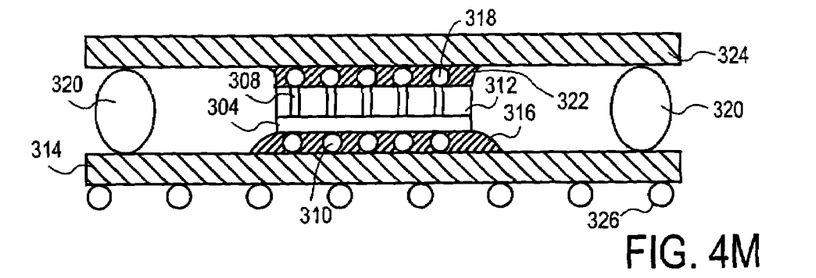
FIG. 4M illustrates a finished package assembly.

The process 200 is finished in finish block 228. FIG. 4M illustrates a finished package assembly 300. Once the BGA balls 326 are attached, the package assembly 300 is complete and the packaging process can be finished in order to provide a working IC or microprocessor.

One skilled in the art would recognize that several variations may be made to the embodiments described herein without departing form the broader spirit of the invention. For example, the BGA interconnects 326 may be mounted on the backside substrate 324 instead frontside substrate 314. Also, different techniques, processes, and materials may be used.

This invention has been described with reference to specific exemplary embodiments thereof. It will, however, be evident to persons having the benefit of this disclosure that various modifications and changes may be made to these embodiments without departing from the broader spirit and scope of the invention. The specification and drawings, are accordingly, to be regarded in an illustrative rather than in a restrictive sense.

What is claimed is:

1. An apparatus, comprising:
   a semiconductor die including active circuitry formed on a frontside and having a plurality of conductive through vias formed therein from the frontside to a backside, the die comprising a power requirement and an external signal requirement;
   a plurality of first interconnects formed on a frontside of the die and a plurality of second interconnects formed on a backside of the die, respective ones of the plurality of second interconnects coupled to the plurality of through vias; and
   a first package substrate electrically coupled to the plurality of first interconnects and a second package substrate electrically coupled to the plurality of second interconnects,
   wherein a portion of at least one of the power requirement and the external signal requirement is supplied through the first package substrate and a remainder portion of at least one of the power requirement and the external signal requirement is supplied through the second package substrate.

2. The apparatus of claim 1, further comprising a first underfill layer between the front side of the die and the first substrate and a second underfill layer between the backside of the die and the second substrate.

3. The apparatus of claim 1, further comprising a substrate ball electrically coupled between the first and second substrates.

4. The apparatus of claim 1, wherein the plurality of the first interconnects and the plurality of the second interconnects comprise solder balls.

5. The apparatus of claim 1, wherein the semiconductor die is thinned using one selected from the group consisting of a backgrinding process, a chemical mechanical polishing (CMP) process, and a spin etching process.

6. The apparatus of claim 2, wherein the underfill layers comprise a no-flow underfill material.

7. A method, comprising:
   forming a plurality of conductive through vias in a back side of a semiconductor die including active circuitry on a frontside and coupling a plurality of first interconnects to respective ones of the plurality of through vias;
   coupling a plurality of second interconnects to a frontside of the die;
   electrically coupling the plurality of first interconnects to a first substrate; and
   electrically coupling the plurality of second interconnects to a second substrate,
   wherein a portion of at least one of a power requirement of the die and an external signal requirement of the die is supplied through the first substrate and a remainder portion of at least one of the power requirement and the external signal requirement is supplied through the second substrate.

8. The method of claim 7, wherein the plurality of through vias connect with the device side.

9. The method of claim 7, wherein the plurality of first interconnects and the plurality of second interconnects comprise solder balls.

10. The method of claim 7, further comprising thinning the semiconductor die.

11. The method of claim 7, wherein the first and second underfill layers comprise a no-flow underfill.

12. The method of claim 7, further comprising:
    dispensing a first underfill layer on the first package substrate; and
    dispensing a second underfill layer on the backside of the semiconductor die.

13. The method of claim 12, further comprising:
    attaching a substrate ball between the first and second package substrates.

14. An apparatus comprising:
    a die including device circuitry on a first side and a second side opposite the front side;
    a plurality of contact points on the second side of the die; and
    a plurality of conductive through vias coupling the device circuitry to the contact points,
    wherein a portion of at least one of a power requirement and an external signal requirement of the die may be met through electrical connections to the contact points.

15. The apparatus of claim 14, wherein the contact points comprise a first set of contact points, the apparatus further comprising a second set of contact points on the first side of the die and coupled to the device circuitry, wherein a remainder portion of at least one of the power requirement and the external signal requirement of the die may be met through electrical connections to the contact points.

* * * * *